United States Patent [19]

Chapman et al.

[11] 4,305,047

[45] Dec. 8, 1981

[54] FEEDBACK CIRCUIT FOR CONTROLLING THE PEAK OPTICAL OUTPUT POWER OF AN INJECTION LASER

[75] Inventors: Lynn C. Chapman, Gaithersburg; David W. Matthews, Mt. Airy; John Giganti, Olney, all of Md.

[73] Assignee: Digital Communications Corp., Germantown, Md.

[21] Appl. No.: 83,121

[22] Filed: Oct. 9, 1979

[51] Int. Cl.³ .............................................. H01S 3/13
[52] U.S. Cl. ............................................. 331/94.5 S
[58] Field of Search .................................. 331/94.5 S

[56] References Cited

U.S. PATENT DOCUMENTS 4,009,385 2/1977 Sell .................................. 331/94.5 S Primary Examiner—Martin H. Edlow Attorney, Agent, or Firm—Pollock, Vande Sande & Priddy

[57] ABSTRACT

An injection laser is turned on and off in response to DATA and $\overline{\text{DATA}}$ control signals. A photodiode is irradiated by the laser and passes current that is proportional to the intensity of the laser radiation. A current switch responds to the $\overline{\text{DATA}}$ signal to define a current path for the source current of associated source current transistors when the laser is on. A difference current, corresponding to the difference between the photodiode current and the source current, is then applied to an integrator. The integrator generates an error signal corresponding to the difference in charge transfer between the photodiode and the source current transistors. The error signal is applied to operate a bias transistor that generates a corresponding DC bias current for the turned on laser.

6 Claims, 1 Drawing Figure

FEEDBACK CIRCUIT FOR CONTROLLING THE PEAK OPTICAL OUTPUT POWER OF AN INJECTION LASER

DESCRIPTION

1. Technical Field

The invention relates to a feedback circuit for controlling the peak optical output power of an injection laser and, more particularly, to such a circuit that includes means for controlling the DC bias current of the laser in response to laser output in only one of two laser states.

2. Background Art

Injection lasers have been proposed as a radiation source which can be used to transmit information by modulating the laser driving current with data signals representing the intelligence to be transmitted. Such lasers have a nonlinear operating characteristic wherein optical output increases slowly with increases in driving current up to a threshold, above which threshold, optical output increases more rapidly with respect to driving current. To satisfy the joint requirements of maximizing the signal to noise ratio and the on/off ratio, it has been proposed to operate the laser at the "knee" of the operating characteristic.

Thus, the laser driving current is composed of a DC bias current and a data signal current, and desirably the DC bias current operates the laser at the "knee" of the characteristic.

In prior art laser control systems, for example as disclosed in "Bell System Technical Journal", Vol. 57, No. 6, (July-August, 1978), it is known to control laser output by irradiating a photodiode with a pulsed laser and applying the corresponding current output of the photodiode to an RC filter circuit that generates a delayed signal corresponding to the average power of the laser. The average power signal is then compared to a reference power signal and a corresponding error signal is generated and is applied to control the DC bias current of the laser.

Such prior art feedback control circuits have the disadvantage that the DC bias current is generated in response to an average power measurement and, therefore, the bias current is influenced by the data pattern being transmitted.

Thus, prior art laser control systems do not operate efficiently when the laser is held in a particular operational state for a period of time and is then switched to the opposite operational state. For example, if a laser is maintained in an on state, the RC filter circuit of a prior art control system will generate an average power signal and a corresponding DC bias current that is too high for the laser's continuous state of operation, since the prior art circuit cannot distinguish a laser that is continuously on and a laser that is intermittently turned on at a relatively high level. Furthermore, when the laser is turned off, the DC bias current will be maintained at an excessively high level for a period of time corresponding to the RC time constant of the filter circuit.

Alternatively, if the laser is maintained in an off state for a period of time, and, thereafter, the laser is turned on again, the prior art control circuit will not initially provide a sufficiently high DC bias current since the average power signal of the circuit will not reflect the instantaneous value of the optical output of the laser.

Prior art systems also have the disadvantage that a relatively high back bias voltage, for example 10 to 20 volts, is required for a photodiode in order to ensure that a sufficiently distinctive waveform is provided at the output of the photodiode in response to the radiation of the laser.

Accordingly, it is a primary object of the invention to provide a feedback circuit for controlling the peak optical output power rather than the average optical output power of an injection laser.

Another object of the invention is to provide such a circuit that generates a DC bias feedback current for the laser that is adjusted only during the "on" operational state of the laser.

A further object of the invention is to provide a feedback control circuit that operates to generate a DC bias feedback current that closely follows the operational on condition of a laser despite changes in the duty cycle or pattern of the operational on/off data signals for the laser.

Another object of the invention is to provide a feedback control circuit for controlling the peak optical output of a laser wherein a photodiode is operated with a relatively small reverse bias voltage.

A further object of the invention is to provide a feedback control circuit that holds the peak optical output of a laser constant when a loss of data occurs and that maintains a constant output until a data input is resumed.

These and other objects of this invention will become apparent from a review of the detailed specification which follows and a consideration of the accompanying drawings.

DISCLOSURE OF THE INVENTION

In order to achieve the objects of the invention and to overcome the problems of the prior art, the circuit for controlling the peak optical output power of an injection laser, according to the invention, includes a controlled source of DC bias current for the laser and transistors for turning on and off the laser in response to DATA and $\overline{\text{DATA}}$ signals, with a photodiode for passing current that is proportional to the intensity of the laser radiation. A current switch comprised of two schottky diodes responds to the $\overline{\text{DATA}}$ signal to define a current path for an associated "laser on" current source when the laser is on. A difference current, corresponding to the difference between the photodiode current and the current of the "laser on" source, is then applied to an integrator.

The integrator integrates the difference current and stores an error signal corresponding to the total difference in charge transfer between the photodiode and the current source. The error signal is applied by the integrator to a DC bias control transistor that applies a corresponding DC bias current to the injection laser.

When the laser is operated in an off state in response to a DATA signal, the current switch is operated to block the flow of low level photodiode current through the current source and to shunt the low level current of the photodiode to a minus voltage portion of the circuit. Thus, the output of the photodiode is sampled and a corresponding error signal is stored only when the laser is in the on state.

BEST MODE FOR CARRYING OUT THE INVENTION

Figure 1:
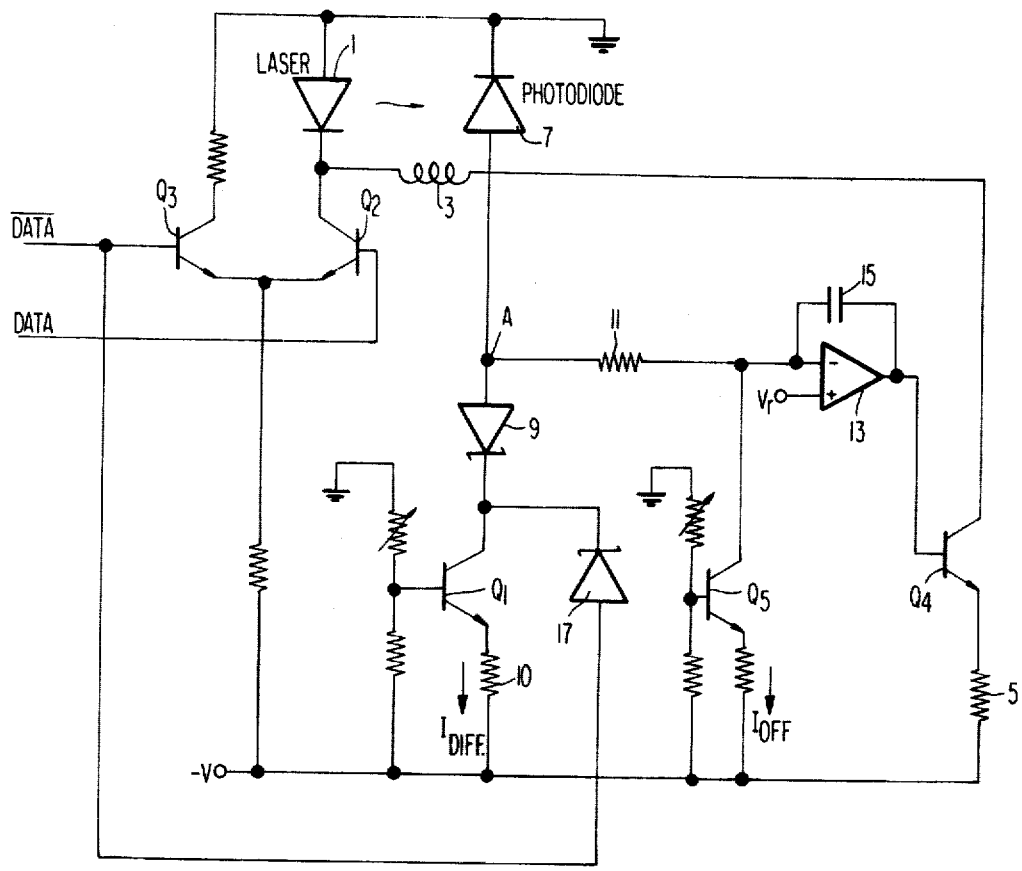
FIG. 1 illustrates a circuit diagram of a preferred embodiment of an apparatus for controlling the peak optical output power of an injection laser.

The remaining portion of this specification will describe preferred embodiments of the invention when read in conjunction with the attached drawings, in which like reference characters identify identical apparatus.

FIG. 1 illustrates a circuit diagram of a feedback circuit for controlling the peak optical output power of an injection laser 1 that is turned on and off in response to data input signals. In operation, the laser 1 is turned on in response to a DATA input signal that is applied at the base of a transistor Q2 to turn on the transistor and to thereby cause driving current to be applied to the laser. This driving current and a DC bias current through an inductor 3, a transistor Q4 and a resistor 5, drive the injection laser 1. The laser is turned off in response to a $\overline{DATA}$ signal that is applied at the base of the transistor Q3 to turn on the transistor and to thereby cause current to be shunted around the laser 1.

It will be appreciated by those skilled in the art that the $\overline{DATA}$ signal is merely an inverted DATA signal and, therefore, the transistors Q2 and Q3 cannot be activated simultaneously.

It will also be appreciated by those skilled in the art that the optical output of the injection laser 1 increases rapidly in response to increments of input driving current above a particular threshold current level. Current applied at or below the threshold level results in only a small optical output. Accordingly, in order to operate the injection laser 1 efficiently, it is necessary to apply a DC bias current to ensure that increments of driving current for the laser will be applied above the threshold current level. As the laser 1 is turned on and off in response to DATA and $\overline{DATA}$ signals, it is desirable to control the peak optical output of the laser by adjusting the DC bias current when the laser is on.

The DC bias current for the injection laser 1 is determined by the amount of current that flows through the inductor 3 and the corresponding transistor Q4 and resistor 5. The transistor Q4 is controlled in accordance with the invention to provide a particular DC bias current for the injection laser 1 which bias current is adjusted only when the laser is turned on.

More particularly, when the laser is turned on in response to conduction in transistor Q2, a portion of the output of the laser is optically coupled to a photodiode 7. The photodiode 7 passes a particular electrical current that is proportional to the intensity of the incident laser radiation, and the current is split at a node A into a current $I_{DIFF}$ and an "off" current $I_{OFF}$. Typically, the $I_{ON}$ current is ten times the magnitude of the $I_{OFF}$ current. However, other ratios of $I_{ON}$ and $I_{OFF}$ may be employed without departing from the spirit of the invention.

The sum of the current $I_{DIFF}$ and the off current $I_{OFF}$ of the photodiode 7 defines the nominal current that passes through the photodiode when the laser is turned on and the DC bias is properly adjusted. Thus, it will be appreciated by those skilled in the art that the transistors Q1 and Q5 operate as current sources.

The transistors Q1 and Q5 are employed to provide stable current sources that will operate over a wide range of temperatures. However, it should be appreciated that either or both of the transistors Q1 and Q5 may be replaced by suitable resistors to provide a somewhat less stable current source, without departing from the spirit of the invention.

When the injection laser 1 is turned on, the absence of a $\overline{DATA}$ signal causes a schottky diode 9 to be biased to conduct the $I_{DIFF}$ current from the node A to the conducting transistor Q1 and a resistor 10. The transistor Q5 also conducts to pass the current $I_{OFF}$. A difference current corresponding to the difference between the photodiode current and the sum of $I_{DIFF}$ and $I_{OFF}$ is passed through the resistor 11 and is applied to an operational amplifier 13 and associated capacitor 15 that integrate the difference current so that the total difference in charge transfer is stored in the capacitor 15. Thus, the operational amplifier 13 and capacitor 15 generate a voltage that corresponds to the total difference in charge transfer between the photodiode and the transistors Q1 and Q5.

The stored voltage of the capacitor 15 is applied to the base of a transistor Q4 to turn on the transistor and to thereby adjust the conducting state of the transistor so that a particular associated DC bias current is applied to the laser 1.

It should be understood that when a relatively large difference current is flowing through the resistor 11, the transistor Q4 is weakly turned on and, therefore, a small current flows through the transistor Q4. Likewise, when a smaller difference current flows through the resistor 11, the transistor Q4 is operated by the operational amplifier 13 and capacitor 15 to conduct a relatively larger amount of current.

When the laser is turned off in response to the $\overline{DATA}$ signal, a schottky diode 17 is biased to conduct so that the transistor Q1 pulls current through the diode 17 rather than through the diode 9. Thus, the schottky diodes 9 and 17 operate as a current switch that is controlled by the $\overline{DATA}$ signal that turns off the laser 1.

The switching action of the schottky diodes 9 and 17 causes the output of the photodiode 7 to be sampled, and the difference in charge transfer stored, only when the laser is turned on. Thus, the schottky diodes 9 and 17 operate to adjust the DC bias of the laser only when the laser is turned on, and, therefore, the circuit of FIG. 1 operates to control the peak optical output of the laser rather than the average power of the laser.

The "off" state of the laser 1 is defined at a particular low energization of the laser so that when the laser is off, a low level of radiation is applied to the photodiode 7. The circuit of FIG. 1 is calibrated so that the small off current $I_{OFF}$ flows through the photodiode when the laser is operated in the off state. As explained previously, when the laser is in the off state, the diode 9 blocks the flow of current from the photodiode to Q1 and the diode 17 passes an alternate current to Q1. When the laser is off, the $I_{OFF}$ current that flows through the photodiode 7 is shunted to the minus voltage portion of the circuit through the conducting transistor Q5.

Thus, while the laser is on, the transistor Q4 applies an adjusted DC bias current that is proportional to the charge transfer difference that is stored on the capacitor 15. When the laser is operated in the off state, the DC bias current is maintained at the level set during the previous on state, since the capacitor retains its charge.

It should be understood that the circuit of FIG. 1 provides a DC current feedback signal that closely follows the "on" optical output of the injection laser 1 and, therefore, is not subject to feedback errors caused by changes in the duty cycle of the data signal or changes in the control pattern of the signal. Also, since the control circuit of FIG. 1 operates in response to small changes in charge accumulation with respect to the photodiode, the photodiode may be operated with a relatively smaller reverse bias voltage than is required for providing a distinct waveform at the output of the photodiodes of prior art systems.

Moreover, when loss of data occurs, the control loop of FIG. 1 operates to hold the peak optical output of the injection laser 1 constant until a data input is resumed, since the output of the operational amplifier 13 and the capacitor 15 will be maintained constant until new data signals are applied to adjust the level of the integrated voltage at the capacitor 15.

A referene voltage Vr is applied at the positive terminal of the operational amplifier 13. The reference voltage Vr may typically be set at a voltage level that is halfway between the voltage levels of the data signals that are applied to the circuit of the invention. For an experimental circuit, the voltage swing of DATA or $\overline{\text{DATA}}$ signals was set to range from −0.8 volts to −1.8 volts. Therefore, for such a circuit, the reference voltage Vr is approximately −1.3 volts. However, other reference voltages may be employed without departing from the spirit of the invention. In addition, it should be understood that the ground connection for the photodiode and laser of FIG. 1 may be suitably replaced by a positive voltage connection, without departing from the invention.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

We claim:

1. Apparatus for controlling bias current of a laser, comprising:

means for operating said laser in an on state and an off state in response to particular data signals;

photodiode means for receiving at least a portion of the radiation of said laser and for passing a photodiode current corresponding to the intensity of incident laser radiation; and means for processing said photodiode current when the laser is operated in said DIFF. state to control said bias current for said laser wherein said means for processing includes: first fixed current source means for supplying a fixed current; and second switched current source means for supplying a second fixed current in dependence on said data signals; means for connecting said sources to a node, and to said photodiode means; said processing means including means responsive to a sum of currents derived from said current sources and said photodiode means for controlling said bias current.

2. The apparatus of claim 1 which further includes; an integrator in said processing means coupled to said node for integrating a signal input thereto, and biasing means controlled by an output of said integrator for supplying said bias current.

3. The apparatus of claim 2 wherein said biasing means includes means for generating a laser bias current that is inversely proportional to said output of said integrator.

4. The apparatus of claim 2 wherein:

said first fixed current source means conducts current $I_{off}$ corresponding to photodiode current generated by said laser operating in an OFF state, and said second switched current source means comprises a current source conducting a current $I_{DIFF}$ comprising the difference between $I_{OFF}$ and the photodiode current generated by a laser in an ON state operating at an appropriate bias point and includes switching means comprising a first diode coupling said node to said source and a second diode means for blocking said first diode when said data signals control said laser to an OFF state whereby said second current source conducts current when said laser is in an ON state.

5. The apparatus of claim 4 wherein said first fixed current source means comprises a transistor biased to conduct a current $I_{OFF}$.

6. The apparatus of claim 4 or 5 wherein said second switched current source means includes a transistor biased to conduct a current $I_{DIFF}$.

* * * * *